United States Patent
Camp et al.

(10) Patent No.: US 9,298,549 B2
(45) Date of Patent: Mar. 29, 2016

(54) READ BUFFER ARCHITECTURE SUPPORTING INTEGRATED XOR-RECONSTRUCTED AND READ-RETRY FOR NON-VOLATILE RANDOM ACCESS MEMORY (NVRAM) SYSTEMS

(71) Applicant: International Business Machines Corporation, Armonk, NY (US)

(72) Inventors: Charles J. Camp, Sugar Land, TX (US); Timothy J. Fisher, Cypress, TX (US); Aaron D. Fry, Richmond, TX (US); Ashwitha Krishna Kumar, Houston, TX (US); David A. Pierce, Houston, TX (US); Kevin E. Sallese, Plainfield, IL (US); Lincoln T. Simmons, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 14/103,644

(22) Filed: Dec. 11, 2013

(65) Prior Publication Data

US 2015/0161004 A1     Jun. 11, 2015

(51) Int. Cl.
*G06F 11/00*     (2006.01)
*G06F 11/10*     (2006.01)
(Continued)

(52) U.S. Cl.
CPC .......... *G06F 11/1076* (2013.01); *G06F 3/0619* (2013.01); *G06F 3/0647* (2013.01); *G06F 3/0689* (2013.01); *G06F 11/141* (2013.01)

(58) Field of Classification Search
CPC ............ G06F 11/1076; G06F 11/2053; G06F 11/0727; G06F 11/10; G06F 11/1032; G06F 11/1402; G06F 3/0647; G06F 3/0689; G06F 3/0619
USPC ................ 714/52, 6.1, 6.11, 6.2, 6.24, 42, 54
See application file for complete search history.

(56) References Cited

U.S. PATENT DOCUMENTS 6,687,850 B1   2/2004  Rothberg
7,177,989 B1   2/2007  McGinnis
(Continued)

FOREIGN PATENT DOCUMENTS

JP     410154941      6/1998
JP     2010102640     5/2010
(Continued)

OTHER PUBLICATIONS

Cai, Yu, et al., "Threshold Voltage Distribution in MLC NAND Flash Memory: Characterization, Analysis, and Modeling", In Proceedings of the Conference on Design, Automation and Test in Europe, EDA Consortium, 2013, pp. 1285-1290.
(Continued)

*Primary Examiner* — Joseph D Manoskey
(74) *Attorney, Agent, or Firm* — Zilka-Kotab, PC (57) ABSTRACT

According to one embodiment, a system includes a read buffer memory configured to store data to support integrated XOR reconstructed data and read-retry data and logic configured to receive data units and read command parameters used to read the data units from a non-volatile random access memory (NVRAM) device, determine which read buffers from the read buffer memory to store the data units, determine an error status for each of the data units, wherein the error status indicates whether each data unit includes errored data or error-free data, store each error-free data unit and the read command parameters to a corresponding read buffer, reject each errored data unit without affecting a corresponding read buffer, and retry to read only errored data units from the NVRAM device until each of the data units is stored in the read buffer memory.

20 Claims, 5 Drawing Sheets

(51) Int. Cl.
*G06F 3/06* (2006.01)
*G06F 11/14* (2006.01)

(56) References Cited

U.S. PATENT DOCUMENTS

| | | |
|---|---|---|
| 2004/0264309 A1 | 12/2004 | Stolowitz |
| 2005/0279837 A1* | 12/2005 | Hajji ............................ 235/492 |
| 2005/0283655 A1 | 12/2005 | Ashmore |
| 2009/0141544 A1 | 6/2009 | Sakimura et al. |
| 2012/0284587 A1 | 11/2012 | Yu |
| 2014/0047269 A1* | 2/2014 | Kim ................................. 714/16 |
| 2014/0056068 A1* | 2/2014 | Strasser et al. ............ 365/185.03 |
| 2014/0164881 A1* | 6/2014 | Chen et al. .................... 714/773 |

FOREIGN PATENT DOCUMENTS

| | | |
|---|---|---|
| JP | 02012198727 | 10/2012 |
| WO | WO9917212 | 4/1999 |

OTHER PUBLICATIONS

Salkham, et al., "Design of a CDD-Based Fault Injection Framework for AUTOSAR Systems", In Proceedings of Workshop SASSUR (Next Generation of System Assurance Approaches for Safety-Critical Systems) of the 32nd International Conference on Computer Safety, Reliability and Security, 2013, pp. 1-12.

Benjauthrit, Boonsieng, et al., "An Overview of Error Control Codes for Data Storage", In Nonvolatile Memory Technology Conference, 1996., Sixth Biennial IEEE International, IEEE, 1996, pp. 120-126.

\* cited by examiner

FIG. 5

READ BUFFER ARCHITECTURE SUPPORTING INTEGRATED XOR-RECONSTRUCTED AND READ-RETRY FOR NON-VOLATILE RANDOM ACCESS MEMORY (NVRAM) SYSTEMS

BACKGROUND

The present invention relates to data storage, and more specifically, the present invention relates to a read buffer architecture capable of supporting integrated XOR-reconstructed and read-retry data reconstruction for non-volatile random access memory (NVRAM) systems.

NVRAM, such as flash memory (including "negated AND or NOT AND" (NAND) flash memory, NOR flash memory, multi-level cell (MLC) NAND flash memory), phase change memory (PCM), magnetoresistive RAM (MRAM), resistive RAM (RRAM), etc., provides a non-volatile electrically reprogrammable storage medium at a lower cost and having higher performance in comparison to hard disk drives (HDDs) due to its higher data density. This higher density, although beneficial, is not without its own problems. One such problem is a higher error rate and shorter data retention time for data stored to MLC NAND flash memory. To enable MLC NAND flash memory to be a viable medium for enterprise-level storage, several techniques are conventionally used to improve its error performance and long-term reliability.

A first technique is a robust error correction code. A tradeoff is made between error correction strength (a number of bits that can be corrected per unit of data) and additional space required for redundant information that is used in the error correction. As NAND flash memories "age," the number of errors per unit of data stored may exceed the error correction capability of even the most strenuous error correction schemes. When a sector of data is uncorrectable, other techniques must be used to recover the originally stored data.

Data retrieval from MLC NAND flash memories is highly sensitive to the voltage threshold used to distinguish between values of bits (e.g., 0's and 1's). This is especially true in MLC flash memory where a single memory cell encodes the values of multiple bits (thus requiring multiple voltages). Current storage devices provide the ability to adjust their read threshold voltages. Simply rereading the data from the flash memory with a different voltage threshold is often sufficient for retrieving data units that are otherwise uncorrectable. Provisions are made for: a) recognizing that an uncorrectable unit of data has been read; b) adjusting the threshold voltage(s); c) recreating the original read operation; d) storing read data; e) recognizing when a successful read has occurred, or recognizing when a predetermined number of retry attempts has failed.

Another method for recovering data in the presence of read errors is accomplished by using a variation on the concepts of redundant array of inexpensive disks (RAID) striping. In RAID, multiple identically sized units of independent data are grouped in a "stripe," along with an additional "parity" bit or unit. As the units that make up the stripe are written to flash memory, XOR parity is accumulated across the stripe. When all the data units have been written, the accumulated XOR unit is written to complete the stripe. Should any data unit in the stripe exhibit uncorrectable errors, the original data can be recovered by XORing the data from all other data units in the stripe. To recover data from a RAID stripe, provisions are made for: a) recognizing that an uncorrectable unit of data has been read; b) initiating reads of the other data units in the stripe; c) accumulating parity as the stripe is read; d) monitoring error status as the data unit is read; e) recognizing when the complete stripe has been read and data has been successfully recovered. Note that reading the full RAID stripe for reconstruction imposes a significantly larger penalty on system performance than retrying reads with adjusted voltage threshold(s).

A typical read error recovery scenario, then, involves: a) some number of threshold-adjusted rereads of the failing data unit; and b) if the rereads fail to correct the error, reading all the other data units in the stripe to recover the original data (RAID reconstruct). An interesting situation occurs when errors are encountered during a RAID reconstruct operation, potentially invalidating the XOR accumulation. These types of errors are not easily recoverable and may lead to a RAID reconstruction failure.

SUMMARY

According to one embodiment, a system includes a read buffer memory configured to store data to support integrated XOR reconstructed data and read-retry data, the read buffer memory including a plurality of read buffers, each read buffer being configured to store at least one data unit, and a processor and logic integrated with and/or executable by the processor, the logic being configured to cause the processor to receive one or more data units and read command parameters used to read the one or more data units from at least one non-volatile random access memory (NVRAM) device, determine which read buffers from the read buffer memory to store the one or more data units, determine an error status for each of the one or more data units, wherein the error status indicates whether each data unit includes errored data or error-free data, store each error-free data unit and the read command parameters to a corresponding read buffer, reject each errored data unit without affecting a corresponding read buffer, and retry to read only errored data units from the at least one NVRAM device until each of the one or more data units is stored in the read buffer memory.

In another embodiment, a method for reading data from NVRAM includes issuing a read request to read one or more units of data from at least one NVRAM device, the read request including one or more read voltage thresholds, receiving the one or more data units and read command parameters used to read the one or more data units from the at least one NVRAM device, performing error correction on the one or more data units, the error correction producing an error status for each data unit, wherein the error status indicates whether each data unit includes errored data or error-free data, determining which of a plurality of read buffers to store each of the one or more data units, wherein a read buffer memory includes the plurality of read buffers, storing each error-free data unit, the read command parameters, and a read completion status to one of the plurality of read buffers, wherein the read completion status indicates a completed read when the data unit is error-free and indicates an incomplete read when the data unit is errored, storing the read command parameters, the error status, and the read completion status in one of the plurality of read buffers for each errored data unit and locking the read buffer; and retrying to read each errored data unit from the at least one NVRAM device using at least one different read voltage threshold until all of the plurality of read buffers have a data unit stored therein.

In yet another embodiment, a computer program product for reading data from NVRAM includes a computer readable storage medium having program code embodied therewith, the program code readable/executable by a processor to issue a read request to read one or more units of data from at least one NVRAM device, the read request including one or more read voltage thresholds, receive the one or more data units and read command parameters used to read the one or more data units from the at least one NVRAM device, perform error correction on the one or more data units, the error correction producing an error status for each data unit, wherein the error status indicates whether each data unit includes errored data or error-free data, determine which of a plurality of read buffers to store each of the one or more data units, wherein a read buffer memory includes the plurality of read buffers, store each error-free data unit, the read command parameters, and a read completion status to one of the plurality of read buffers, wherein the read completion status indicates a completed read when the data unit is error-free and indicates an incomplete read when the data unit is errored, store the read command parameters, the error status, and the read completion status in one of the plurality of read buffers for each errored data unit and lock the read buffer, and retry to read each errored data unit from the at least one NVRAM device using at least one different read voltage threshold until all of the plurality of read buffers have a data unit stored therein.

Other aspects and embodiments of the present invention will become apparent from the following detailed description, which, when taken in conjunction with the drawings, illustrate by way of example the principles of the invention.

DETAILED DESCRIPTION

In view of the circumstances described previously, in one embodiment, a method is described for writing a file to a plurality of media that reduces the time required for loading and/or unloading that occurs in reading of a plurality of media. Furthermore, a storage system that employs this method is also described according to more embodiments.

According to one general embodiment, a system includes a read buffer memory configured to store data to support integrated XOR reconstructed data and read-retry data, the read buffer memory including a plurality of read buffers, each read buffer being configured to store at least one data unit, and a processor and logic integrated with and/or executable by the processor, the logic being configured to cause the processor to receive one or more data units and read command parameters used to read the one or more data units from at least one non-volatile random access memory (NVRAM) device, determine which read buffers from the read buffer memory to store the one or more data units, determine an error status for each of the one or more data units, wherein the error status indicates whether each data unit includes errored data or error-free data, store each error-free data unit and the read command parameters to a corresponding read buffer, reject each errored data unit without affecting a corresponding read buffer, and retry to read only errored data units from the at least one NVRAM device until each of the one or more data units is stored in the read buffer memory.

In another general embodiment, a method for reading data from NVRAM includes issuing a read request to read one or more units of data from at least one NVRAM device, the read request including one or more read voltage thresholds, receiving the one or more data units and read command parameters used to read the one or more data units from the at least one NVRAM device, performing error correction on the one or more data units, the error correction producing an error status for each data unit, wherein the error status indicates whether each data unit includes errored data or error-free data, determining which of a plurality of read buffers to store each of the one or more data units, wherein a read buffer memory includes the plurality of read buffers, storing each error-free data unit, the read command parameters, and a read completion status to one of the plurality of read buffers, wherein the read completion status indicates a completed read when the data unit is error-free and indicates an incomplete read when the data unit is errored, storing the read command parameters, the error status, and the read completion status in one of the plurality of read buffers for each errored data unit and locking the read buffer; and retrying to read each errored data unit from the at least one NVRAM device using at least one different read voltage threshold until all of the plurality of read buffers have a data unit stored therein.

In yet another general embodiment, a computer program product for reading data from NVRAM includes a computer readable storage medium having program code embodied therewith, the program code readable/executable by a processor to issue a read request to read one or more units of data from at least one NVRAM device, the read request including one or more read voltage thresholds, receive the one or more data units and read command parameters used to read the one or more data units from the at least one NVRAM device, perform error correction on the one or more data units, the error correction producing an error status for each data unit, wherein the error status indicates whether each data unit includes errored data or error-free data, determine which of a plurality of read buffers to store each of the one or more data units, wherein a read buffer memory includes the plurality of read buffers, store each error-free data unit, the read command parameters, and a read completion status to one of the plurality of read buffers, wherein the read completion status indicates a completed read when the data unit is error-free and indicates an incomplete read when the data unit is errored, store the read command parameters, the error status, and the read completion status in one of the plurality of read buffers for each errored data unit and lock the read buffer, and retry to read each errored data unit from the at least one NV RAM device using at least one different read voltage threshold until all of the plurality of read buffers have a data unit stored therein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), NVRAM, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic, software logic such as firmware, operating system, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

Figure 1:
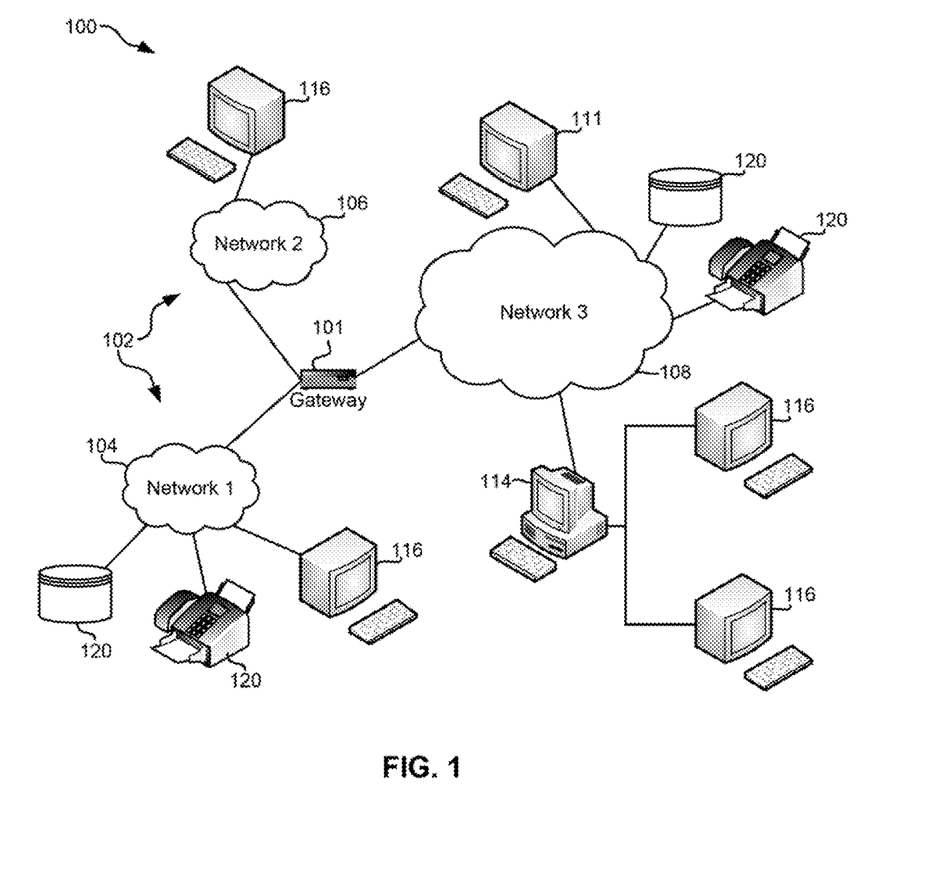
FIG. 1 illustrates a network architecture, in accordance with one embodiment.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
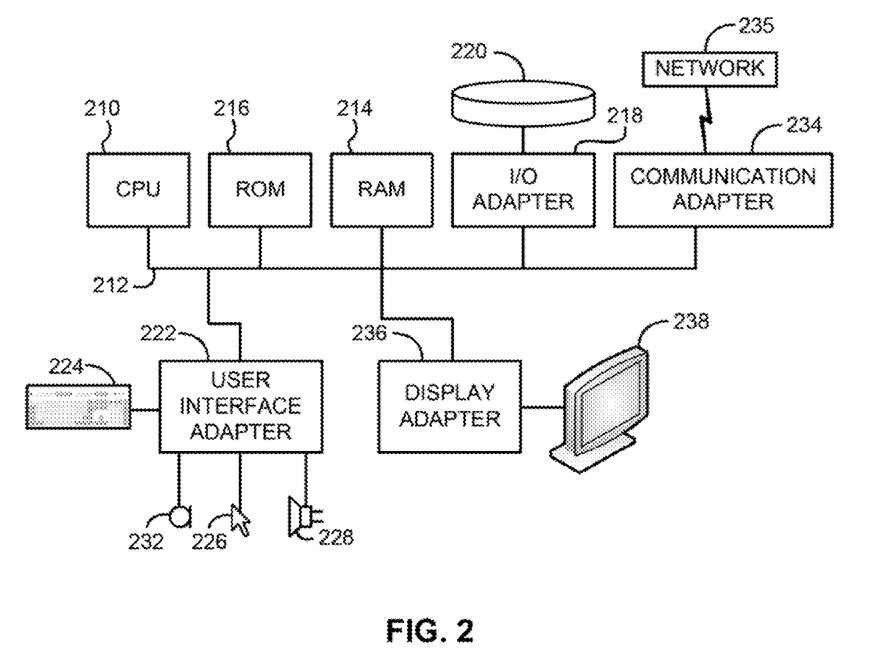
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

The workstation described in FIG. 2 and other computing devices not specifically described herein routinely rely on storage media with which to store data in order to carry out their designated tasks/functions. However, when storing data to storage media or reading data from storage media, various different errors may occur which may corrupt the data and render it unusable for its intended purpose.

Therefore, error correction schemes are typically applied to data, in order to correct these errors. Different types of error correction are possible, which may rely on more or less time and/or processor intensive techniques, such as threshold-adjusted retry-based correction techniques, redundant array of inexpensive disks (RAID)-based reconstruction techniques, etc. Since there is such a difference in computing power and/or time used in the different error correction techniques, it would be beneficial to ensure that only those errors that necessarily invalidate threshold-adjusted retry-based correction techniques are corrected using a RAID-based reconstruction process, with errors that are capable of being corrected by threshold-adjusted retry-based correction techniques being corrected in this way instead. Furthermore, errors in other data units that are not part of an original errored data unit's XOR stripe may be ignored. However, conventional read buffer architectures are not capable of such functionality.

According to one embodiment, a read buffer architecture comprises the following characteristics:

1) Data errors may be corrected before being passed downstream to avoid overhead associated with corrupted data, particularly handling and re-handling of corrupted data.
2) For reads that are larger than the smallest unit of error checking and correction, only failing "pieces" of the larger read operation may be corrected. Good data may be retained until all of the pieces of the larger read operation are valid.
3) When performing RAID reconstruction, data errors may be retried (possibly multiple times) before the accumulated XOR is deemed to be corrupted.
4) Overhead due to data recovery operations minimally impacts system performance.

Current devices lack these characteristics. This is due, in large part, to the strategies employed by these devices for intermediate storage and handling of read data. Specifically, logic and/or storage for "normal" read operations, logic and/or storage for read-retries, and logic and/or storage for XOR accumulation are segregated, either physically, temporally, or both. However, according to one embodiment, these functions and storage may be integrated.

Now, an architecture for the intermediate storage of read data is described according to one embodiment. A set of data buffers are provided for storing read data. Each buffer provides storage for a unit of data (such as a page, a block, a word, a bit, etc.), plus logic configured to:

1) Store error-free data from the read path in one or more buffers.
2) Retrieve data from the one or more buffers.
3) Recognize the error state of incoming read data and reject erroneous data without affecting a corresponding region within the one or more buffers.
4) Optionally XOR current buffer contents with error-free read data in support of XOR reconstruction.
5) Report buffer status, including read completion, error status, and parameters of the original read command to support retries.

In addition to the data buffers themselves, control engines are provided that are configured to, in one or more embodiments:

1) Allocate buffers for read data storage and steer data units to selected buffers.
2) Initiate reread operations for failing data using adjusted read voltage threshold(s).
3) Initiate stripe reads for XOR reconstruction.
4) Read data units from completed buffers and send the read data units to target destination(s).

By using the same buffers throughout the read/retry/rebuild process, the device achieves the characteristics described previously, in at least one such embodiment.

Figure 3:
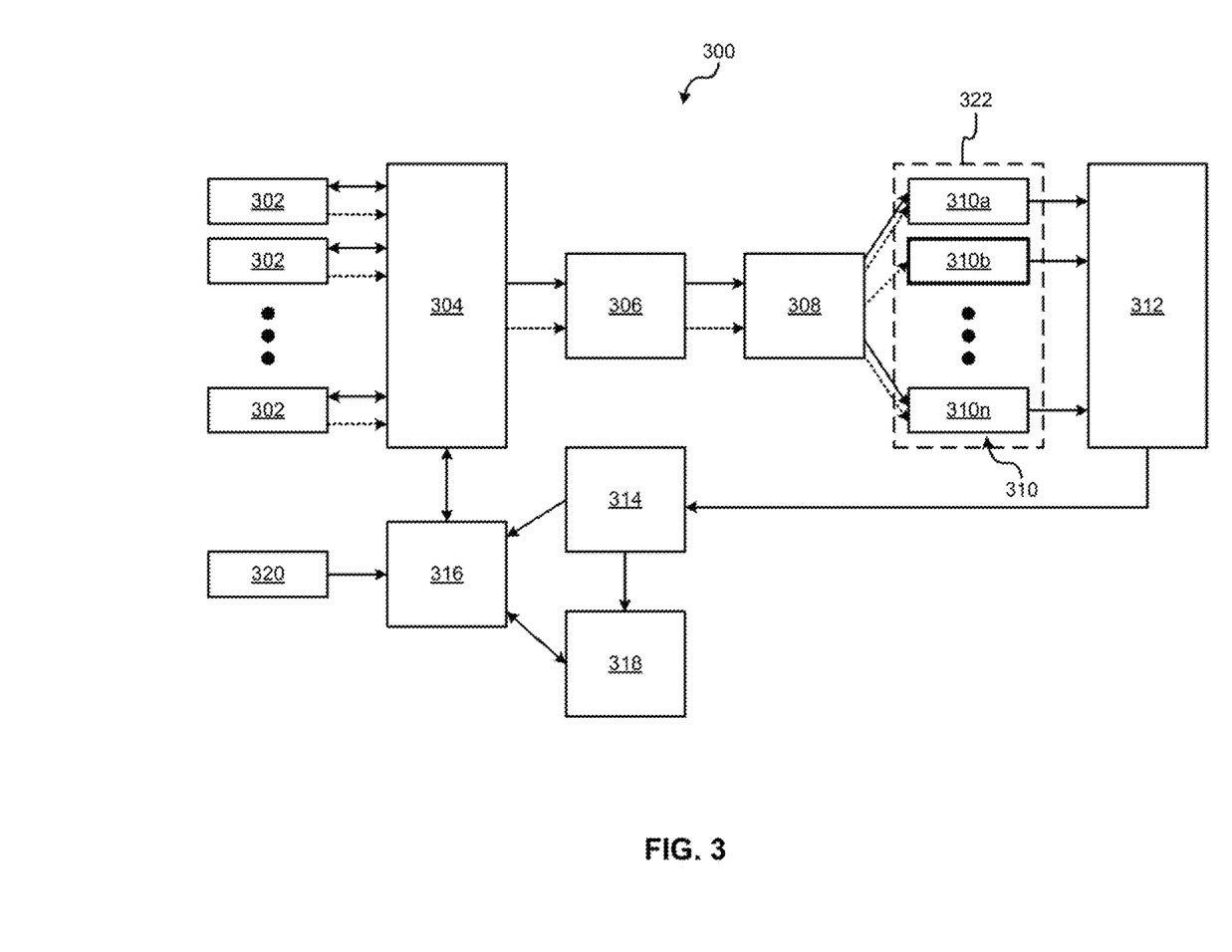
FIG. 3 shows a system architecture for reading data from non-volatile random access (NVRAM) memory device(s) in one embodiment.

FIG. 3 shows a read controller architecture 300, according to one embodiment. A NVRAM read interface module 304 is configured to request data from any connected NVRAM device(s) 302. A request may have a format, in one approach, that includes values of one or more read voltage thresholds. Raw data (indicated by solid line) from the NVRAM device(s) 302 is passed to an error correction module 306, accompanied by information useful and/or necessary (indicated by dashed line) to recreate an original read command used to read data from the NVRAM device(s) 302. When the number of errors is within a correction capability of the error correction module 306, corrected data is passed downstream along with a flag indicating error-free data; otherwise, data having some amount of errors therein ("errored data") is passed downstream with a flag indicating that it is errored data. Read command parameters are passed downstream, as well, in one embodiment.

A read buffer allocator module 308 is configured to select, from a read buffer memory 322, one read buffer 310a, 310b, . . . , 310n to store information in for each data unit received. As shown in FIG. 3, for explanatory purposes only, read buffer 310a is used to store the data unit, error status, read completion status, and command parameters because read buffer 310a has been selected for an error-free data unit (and therefore a solid line and a dashed line are shown leading into read buffer 310a because the error-free data and information is stored therein). In contrast, read buffer 310b has been used to only store error status, read completion status, and command parameters, in accordance with one embodiment, because read buffer 310b has been selected for an errored data unit (and therefore a dashed line is shown leading into read buffer 310b because the errored data is not stored therein). A selection method is used to select which read buffer 310 is used to store the information from all read buffers 310a, 310b, . . . , 310n within the read buffer memory 322, as would be understood by one of skill in the art.

The read buffer allocator module 308 supports a method for explicitly specifying which read buffer 310 to use as part of the read command parameters (as described below). Read buffers 310 are configured to store error-free data, read command parameters associated with the error-free data, error status, and read completion status. Errored data is not stored in the read buffers 310 according to one approach; however, read command parameters associated with the errored data, error status, and read completion status are stored in read buffers 310 in this approach.

A read output engine 312 is configured to analyze the command and status outputs of the read buffer(s) 310, and to select a read buffer 310 to read. Error-free data from read buffers 310 is sent downstream accompanied by command parameters and status. When a read buffer 310 that does not include error-free data is selected, only the associated command and status information is flowed downstream, as the errored data is discarded prior to being stored or after being read, in various approaches.

According to one embodiment, each of the read buffers 310 is configured to be "locked" in order to ensure that read buffers 310 which are selected for errored data are not selected via autonomous selection via the read buffer allocator module 308. Instead, these locked read buffers 310 are configured to only be selected explicitly.

A retry engine 314 is configured to analyze the command and completion status from a selected buffer, and if errored data is indicated (like in read buffer 310b), the retry engine 314 is configured to send retry commands to the command controller 316, and possibly more information necessary or useful in issuing new retry read commands as would be known in the art. Retry commands include some or all of the command parameters that are useful and/or needed to reproduce the original read (via a reproduced read command), plus an index of the errored (and locked) read buffer 310b.

The retry engine 314 is configured to send read retry commands to the command controller 316 until data is returned error-free, or until a maximum number of retries has been reached or exhausted. The command controller 316 may be receive information regarding system reads from a system read command interface 320, in one approach.

The maximum number of retries may be set by a user, set by default, or automatically determined based on a number of factors, such as a total time of processing, an amount of error remaining in the errored data (the less amount the error, the more inclined the system may be to try again), etc. The number of previous retry attempts is also passed in the retry command, in one embodiment, in order to allow the total retry count to be tracked.

The NVRAM read interface module 304 is configured to use the number of previous retry attempts to select one or more new read threshold values to include in a new read request to the NVRAM device(s) 302. When the retry sequence does not yield an error-free set of data, the new read command parameters, including the buffer index, are passed to the XOR rebuild engine 318.

The XOR rebuild engine 318 issues read requests for all the other data units in the RAID stripe of the errored data unit, including a parity unit. The read commands include the errored buffer index in one approach. For exemplary purposes, assuming that read buffer 310b includes information for an errored data unit, the read buffer 310b XOR-accumulates error-free data across all the stripe data units. When all stripe reads are error-free, the read buffer 310b will, by execution of the process described herein, include recovered error-free data for the original data unit, instead of only including error status, read completion status, and command parameters.

When any of the stripe reads include errors, since command and error status pass through the retry engine 314, any errored reads may be retried with one or more adjusted read threshold value(s). Each of the read buffers 310 are also configured to ensure that: a) errored data never affects content or data stored in any of the read buffers 310; b) once error-free data is in a read buffer 310, as a result of either the original read or threshold-adjusted retries, this data is never modified.

Figure 4:
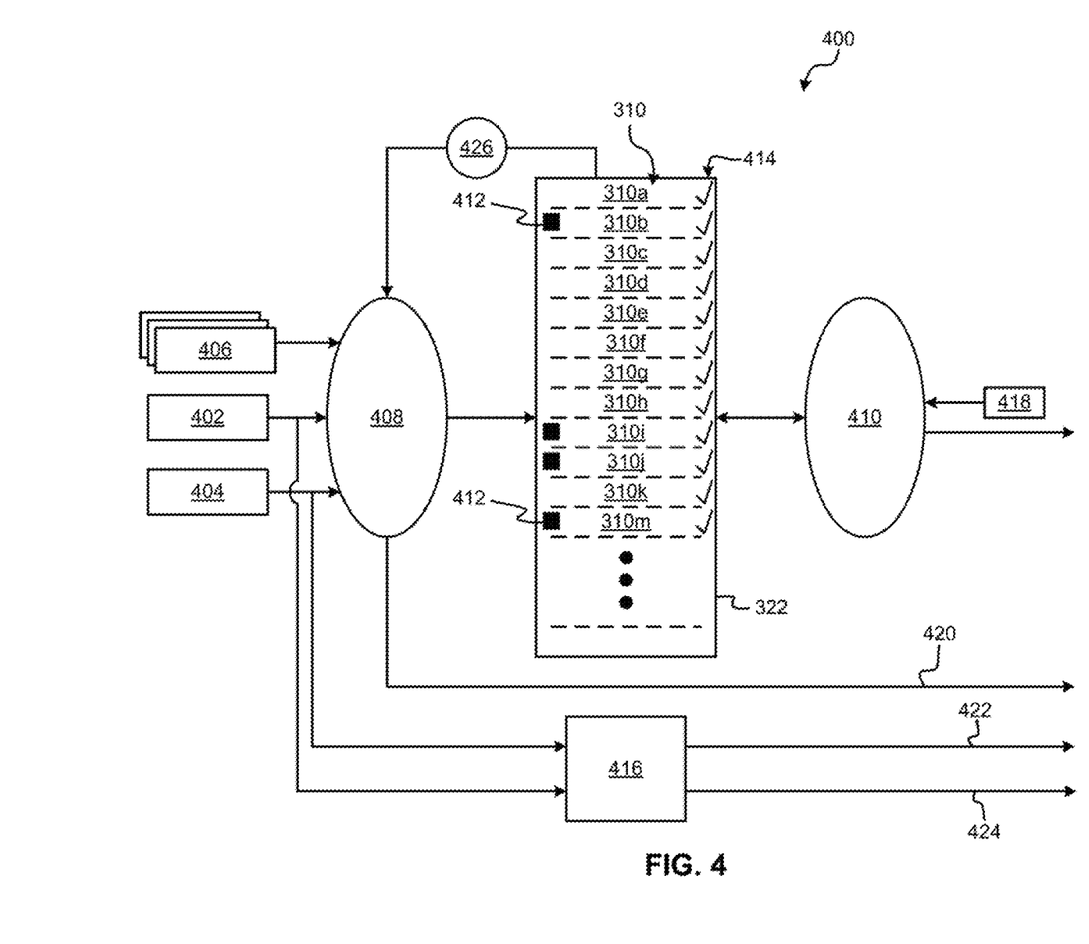
FIG. 4 shows a detailed view of read buffer architecture, according to one embodiment.

Now referring to FIG. 4, a more detailed description of a read buffer design 400 is provided, according to one embodiment. Typically, a read command 402 may include multiple data units. The read buffer memory 322 may comprise any suitable memory type known in the art, such as RAM, EPROM, etc., and may be sized to accommodate a maximum number of data units allowed per read command (each separate memory unit or read buffer 310 is indicated by the dashed lines). The write logic 408 receives the read command 402 and error status 404, and is configured to determine which incoming data units 406 are to be written and whether the write operation is a simple load or an XOR-accumulate.

When the incoming error status 404 indicates an error in the incoming data units 406, data is not written in the read buffer memory 322, and a corresponding read buffer 310 is locked, such as via setting of a lock flag 412, in one approach. Other techniques for locking a read buffer 310 may be used, as would be known to one of skill in the art. For exemplary purposes, read buffers 310b, 310i, 310j, and 310m have been set in FIG. 4. When all data units 406 for a given command have been processed and/or handled, an outgoing completion status 414 alerts downstream modules (such as the read output engine 312, retry engine 314, XOR rebuild engine 318, etc., shown in FIG. 3) of the completion. With reference to FIG. 4, this completion status 414 and the lock flag 412 are also made available at an output 420 to be used by other modules downstream of the read buffer memory 322, in one approach.

When the write is indicated as an XOR-accumulate, current memory contents 426 are made available to the write logic 408 from the buffer memory 322.

Also, the command 402 and error status 404 are made available at their corresponding outputs 422, 424 from a command and status memory 416 where these values are stored during data processing. Setting the lock flag 412 guarantees that the corresponding read buffer 310 is not overwritten by other, unrelated read commands.

Read logic 410 is provided for reading data from the buffer memory 322, and it provides such data at its output. The read logic is configured to receive read requests 418 for the data stored therein.

An exemplary embodiment is now described. In this exemplary embodiment, assume that the maximum allowed number of read data units is four, and that a read command 402 is received for four data units 406. Furthermore, assume that only the first data unit (call it unit 0) returned by the original read is error-free. When all four data units 406 have been received by the write logic 408, the read buffer memory 322 has the following states: data for unit 0 has been written to a read buffer 310, and the status for data unit 0 indicates that it is "good" data free of errors. Data for units 1, 2, and 3 have been discarded, and their corresponding error status (flags) 404 are set to "bad" indicating one or more errors in read buffers 310. Then, the original read command 402 (such as parameters thereof) is available on the command and status memory 416 output, along with the error status 404 and the lock flag 412 for a corresponding read buffer is set. Moreover, the completion status 414 indicates that all data units 406 associated with the read command 402 have been handled (either stored in the read buffer memory 322 or discarded).

In this exemplary embodiment, referring again to FIG. 3, the retry engine 314 now begins a series of threshold-adjusted rereads, with one or more voltage thresholds being adjusted (usually downward, but not always) for each reread of the data units 406, as shown in FIG. 4. The voltage adjustment may be performed according to any method known in the art, such as incremental voltage threshold reductions in each reread attempt, random voltage threshold values for each reread attempt, scaled voltage threshold values designed to provide the greatest chance of reading data according to past experience, etc.

Assume that during that threshold voltage adjustment reread sequence, data unit 1 arrives error-free, while data units 2 and 3 have persistent errors that are not corrected. At the end of this sequence, the buffer status is as follows: data unit 0 still has the error-free data from the original read; data unit 1 has error-free data resulting from a retry of the original read; errored data units 2 and 3 have been discarded (multiple times), and their corresponding error statuses 404 continue to indicate "bad," the read buffer 310 remains locked, and the completion status 414 indicates that all data units 406 have been handled.

In this exemplary embodiment, referring again to FIG. 3, the retry engine 314 identifies that the sequence of retries has been unsuccessful in recovering data for data units 2 and 3, and turns the recovery task over to the XOR rebuild engine 318. The XOR rebuild engine 318 initiates reads for the other data units in the stripes for data units 2 and 3, including the parity units. Assume that all the reads for data unit 2 are error-free. The first data unit from the stripe for data unit 2 is loaded into its corresponding read buffer 310 in the read buffer memory 322, as shown in FIGS. 3-4. All other units for stripe 2 are XORed with the data stored in the read buffer memory 322. When all reads are complete, the recovered data for unit 2 is stored in the read buffer memory 322, and the error status 404 for data unit 2 indicates "good" data therein.

Referring now to FIGS. 3-4, assume that one of the stripe reads for data unit 3 was errored. The retry engine 314, having been monitoring the command 402 and error status 404 outputs from the read buffer memory 322, identifies the error, and responds by initiating a series of threshold-adjusted rereads for the specific errored stripe read. Assume that the third reread returns error-free data, and the maximum number of rereads is greater than three. Data from the first two rereads is discarded. Data from the error-free third reread contributes to the XOR-accumulate in progress, and the retry engine 314 terminates the reread sequence. The XOR-accumulate sequence performed by the XOR rebuild engine 318 completes as usual. In this scenario, data from all four data units is recovered as error-free and stored to the read buffer memory 322.

An alternative ending for this scenario would occur if the error unit in stripe 3 was unresolved by the reread sequence. This indicates that there are two or more "hard" errors in the stripe for data unit 3, and its data is unrecoverable by our assumed read controller architecture. The error status 404 is then reported to higher levels of the memory system (outside of FIGS. 3-4).

This system 300 provides the following benefits, according to various embodiments:
1) Once loaded into the read buffer memory 322, error-free data units are protected from the effects of error recovery for other data units.
2) Rereads and XOR-rebuild sequences are only used for errored data units, minimizing overhead imposed upon the system 300 by error recovery.
3) Overhead is also minimized by allowing threshold-adjusted rereads the opportunity to correct errors encountered during RAID reconstruction.
4) Using the same read buffer memory 322 for error-free data units, data units recovered by threshold-adjusted rereads, and data units recovered by RAID reconstruction simplifies system design by making these low-level error recovery activities transparent to higher level modules. A recovered read differs from an error-free read only in a delay between read request and read completion, providing seamless NVRAM data reading operation.

Figure 5:
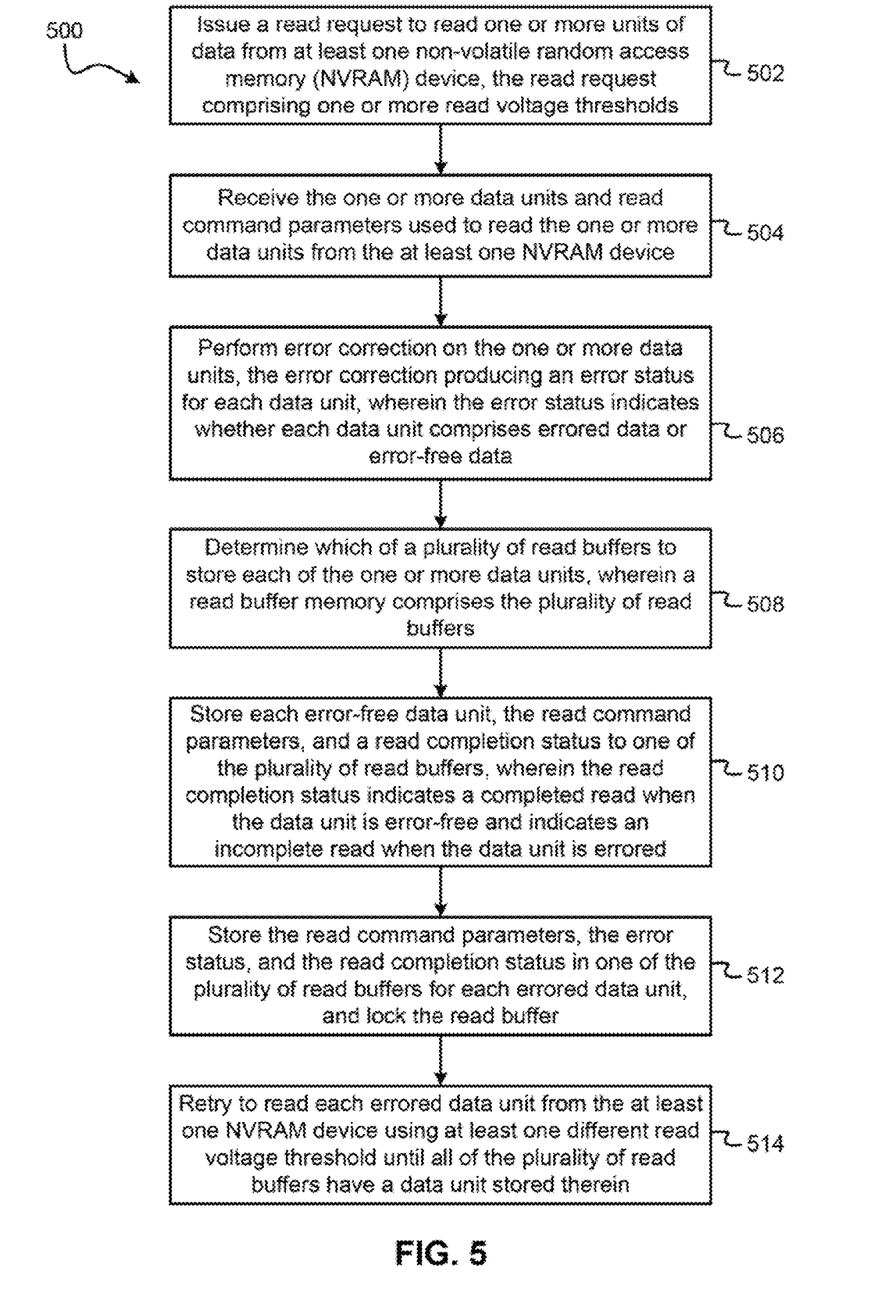
FIG. 5 shows a flowchart of a method for reading data from NVRAM, according to one embodiment.

FIG. 5 shows a flowchart of a process for reading data from NVRAM according to one embodiment. The method 500 may be performed in accordance with the present invention in any of the environments depicted in FIGS. 1-4D, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in one embodiment, the method 500 may be partially or entirely performed by a networking system, a switch, a router, a processor (such as a CPU, an ASIC, an FPGA, etc.), a controller, a server, etc., or any other suitable device or component of a networking system.

As shown in FIG. 5, method 500 may initiate with operation 502, where a read request is issued, the read request being intended to read one or more units of data from at least one NVRAM device. The data units may be any division or subset of the total data stored to the at least one NVRAM device, such as a file, data set, sub data set, directory, page, block, word, bit, etc. The one or more data units may number of total number of data units capable of being stored in read buffers, described later, in one approach.

The read request comprises one or more read voltage thresholds that are to be used in the actual reading operation from the at least one NVRAM device, as would be understood by one of skill in the art. As the read voltage threshold is reduced, more data should be readable from the at least one NVRAM device; however, there is a greater risk of transient and unwanted voltage fluctuations to provide false readings and/or noise in the read data signal.

In operation 504, the one or more data units and read command parameters used to read the one or more data units from the at least one NVRAM device are received, such as by a read controller, NVRAM read interface, processor, etc. The information is received from the at least one NVRAM device, which may be any NVRAM device known in the art, such as NAND flash memory, NOR flash memory, phase change memory (PCM), magnetoresistive RAM (MRAM), resistive RAM (RRAM), etc.

In operation 506, error correction is performed on the one or more data units. Any type of error correction known in the art may be used, such as cyclic redundancy check (CRC)-based error correction, parity bit-based error correction, hash function-based error correction, low-density parity-check (LDPC)-based error correction, Reed-Solomon (RS)-based error correction, etc.

The error correction produces an error status for each data unit, which may be a flag bit set as a 0 or 1, indicating whether each data unit comprises errored data (regardless of a number of errors therein) or error-free data. In another embodiment, the error status may be a multi-bit identifier which provides additional information into type of error, number of errors, etc., so that more informed decision may be made regarding handling of the error(s) in the errored data unit.

In operation 508, which of a plurality of read buffers to store each of the one or more data units is determined, according to a method of selection known in the art. For example, a random distribution across all read buffers may be employed, read buffers may be placed into and retrieved from a queue, according to some function, such as first-in-first-out (FIFO), last-in-first-out (LIFO), etc. A read buffer memory comprises the plurality of read buffers. The read buffer memory is of a type known in the art, such as RAM, ROM, dynamic RAM (DRAM), phase-change memory (PRAM), static RAM (SRAM), electrically erasable programmable read-only memory (EEPROM), etc.

In operation 510, each error-free data unit, the read command parameters, and a read completion status are stored to one of the plurality of read buffers. The read completion status may be a bit indictor and is configured to indicate a completed read when the data unit is error-free and indicates an incomplete read when the data unit is errored, in one approach. A multi-bit completion status may alternatively be used which provides more information, including such information as a number of retries, an amount of error, a sequence of processing up to the current state, etc.

In operation 512, the read command parameters, the error status, and the read completion status are stored in one of the plurality of read buffers for each errored data unit, and the read buffer is locked to prevent corruption by any unrelated read operations, so that error-free data may subsequently be stored therein.

In operation 514, each errored data unit is retried to be read from the at least one NVRAM device using at least one different read voltage threshold until all of the plurality of read buffers have a data unit stored therein. Since the read buffers selected for errored data units were locked, only explicit selection thereof, in a subsequent read operation for the errored data unit, may allow the information stored in the locked read buffer to be changed, altered, and/or accessed, such as to store error-free data therein, along with corresponding read command parameters, error status, and read completion status, in this approach.

In a further embodiment, operation 514 (retrying to read each errored data unit from the at least one NVRAM device) may further include analyzing the read command parameters for each errored data unit and sending one or more retry read requests to the at least one NVRAM device for each errored data unit until an error-free data unit is returned or a maximum number of retries has been exhausted. Each retry read request comprises at least one different read voltage threshold and new read command parameters. Analyzing the read command parameters may include, in various embodiments, any of reading, storing, processing, comparing, selecting, using in a computation or function, etc., the read command parameters, as would be known to one of skill in the art, in order to formulate one or more retry read requests that are more likely to extract the errored data unit from the at least one NVRAM device with less or no error therein, thereby producing error-free data.

The maximum number of retries may be exhausted after a predetermined number of attempts (as set by a user or determined automatically or arbitrarily), in response to the number of errors in the data unit growing in number, rather than being lessened by each reread, indicating divergent settings being used or uncorrectable error therein, or according to any other scheme or method known in the art.

In another further embodiment, operation 514 (retrying to read each errored data unit from the at least one NVRAM device) may further include issuing read requests for all other data units including a parity unit in a RAID stripe of each errored data unit, receiving error-free data units across each data unit of the RAID stripe, and XOR-accumulating all error-free data units in a corresponding locked data buffer for each errored data unit until each errored data unit is error-free in the read buffer. The RAID stripe for the errored data unit may be determined according to any method known in the art, and the RAID stripe may be based on RAID, although not following each requirement of RAID, such as using separate disks, etc. When all stripe reads for an errored data unit are error-free, the read buffer comprises an error-free data unit. Conversely, when any stripe read include errors, any errored reads are retried with one or more adjusted read threshold values, in order to attempt to acquire error-free data, as would be known to one of skill in the art.

In one embodiment, once an error-free data unit is stored in a read buffer as a result of an original read or a threshold-voltage-adjusted read retry, the error-free data unit is not modified. This prevents unrelated read operations from changing, modifying, or overwriting error-free data during subsequent rereads of other data units. Furthermore, when a data unit is being XOR-accumulated, portions thereof which are error-free are not rewritten or modified, thereby allowing an assembled data unit to be produced over the course of several rereads.

In another embodiment, method 500 is carried out with the proviso or stipulation that an errored data unit does not affect error-free data stored in the plurality of read buffers, for reasons described previously. This proviso is in effect whenever a retry read request is issued and reread data is received from the at least one NVRAM device, in order to ensure that error-free data is not corrupted by errored data or operations related to errored data.

In this approach, locking a read buffer guarantees that the locked read buffer is not overwritten by other unrelated read commands, such as read commands and reread commands related to errored data.

According to one embodiment, a number of data units read from the least one NVRAM device may be less than or equal to a number of the read buffers. In an alternate but related embodiment, a total amount of data in the one or more data units read from the least one NVRAM device may be less than or equal to a total amount of data storage capacity of the buffer memory of the read buffers. Of course, other ways of ensuring that the size of the read buffers is not overwhelmed by the amount of data read from the at least one NVRAM device may be used, as would be known to one of skill in the art.

Method 500 may be performed, according to various embodiments, comprising some or all of the operations described in FIG. 5, in a computer program product, another method, logic, an apparatus, and/or a system, such as a system described in relation to FIG. 3, among others.

In one such embodiment, a system comprises a processor (such as a CPU, ASIC, FPGA, etc.) and logic (hardware, software, or a combination thereof) integrated with and/or executable by the processor. The logic is configured to cause the processor to issue a read request to read one or more units of data from at least one NVRAM device, the read request comprising one or more read voltage thresholds, receive the one or more data units and read command parameters used to read the one or more data units from the at least one NVRAM device, perform error correction on the one or more data units, the error correction producing an error status for each data unit, wherein the error status indicates whether each data unit comprises errored data or error-free data, determine which of a plurality of read buffers to store each of the one or more data units, wherein a read buffer memory comprises the plurality of read buffers, store each error-free data unit, the read command parameters, and a read completion status to one of the plurality of read buffers, wherein the read completion status indicates a completed read when the data unit is error-free and indicates an incomplete read when the data unit is errored, store the read command parameters, the error status, and the read completion status in one of the plurality of read buffers for each errored data unit and lock the read buffer, and retry to read each errored data unit from the at least one NVRAM device using at least one different read voltage threshold until all of the plurality of read buffers have a data unit stored therein.

In another such embodiment, a system includes a read buffer memory configured to store data to support integrated XOR reconstructed data and read-retry data, the read buffer memory comprising a plurality of read buffers, each read buffer being configured to store at least one data unit, and a processor and logic integrated with and/or executable by the processor. The logic is configured to cause the processor to receive one or more data units and read command parameters used to read the one or more data units from at least one NVRAM device, determine which read buffers from the read buffer memory to store the one or more data units, determine an error status for each of the one or more data units, wherein the error status indicates whether each data unit comprises errored data or error-free data, store each error-free data unit and the read command parameters to a corresponding read buffer, reject each errored data unit without affecting a corresponding read buffer, and retry to read only errored data units from the at least one NVRAM device until each of the one or more data units is stored in the read buffer memory.

In yet another such embodiment, a computer program product comprises a computer readable storage medium having program code embodied therewith. The program code is readable and/or executable by a processor to issue a read request to read one or more units of data from at least one NVRAM device, the read request comprising one or more read voltage thresholds, receive the one or more data units and read command parameters used to read the one or more data units from the at least one NVRAM device, perform error correction on the one or more data units, the error correction producing an error status for each data unit, wherein the error status indicates whether each data unit comprises errored data or error-free data, determine which of a plurality of read buffers to store each of the one or more data units, wherein a read buffer memory comprises the plurality of read buffers, store each error-free data unit, the read command parameters, and a read completion status to one of the plurality of read buffers, wherein the read completion status indicates a completed read when the data unit is error-free and indicates an incomplete read when the data unit is errored, store the read command parameters, the error status, and the read completion status in one of the plurality of read buffers for each errored data unit and lock the read buffer, and retry to read each errored data unit from the at least one NVRAM device using at least one different read voltage threshold until all of the plurality of read buffers have a data unit stored therein.

It should be appreciated that the inventions herein may be implemented with a wide range of memory mediums, including, for example, NVRAM technologies such as NAND flash memory, NOR flash memory, PCM, MRAM, and RRAM, among others.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
  a read buffer memory configured to store data to support integrated XOR reconstructed data and read-retry data, the read buffer memory comprising a plurality of read buffers, each read buffer being configured to store at least one data unit; and
  a processor and logic integrated with and/or executable by the processor, the logic being configured to cause the processor to:
    receive one or more data units and read command parameters used to read the one or more data units from at least one non-volatile random access memory (NVRAM) device;
    determine which read buffers from the read buffer memory to store the one or more data units;
    determine an error status for each of the one or more data units, wherein the error status indicates whether each data unit comprises errored data or error-free data;
    store each error-free data unit and the read command parameters to a corresponding read buffer;
    reject each errored data unit without affecting a corresponding read buffer; and
    retry to read only errored data units from the at least one NVRAM device until each of the one or more data units is stored in the read buffer memory.

2. The system as recited in claim 1, wherein the logic configured to cause the processor to retry to read only errored data units from the at least one NVRAM device is further configured to:

analyze the read command parameters for each errored data unit; and send one or more retry read requests to the at least one NVRAM device for each errored data unit until an error-free data unit is returned or a maximum number of retries has been exhausted, each retry read request comprising at least one different read voltage threshold and new read command parameters.

3. The system as recited in claim 2, wherein the logic configured to cause the processor to retry to read only errored data units from the at least one NVRAM device is further configured to:

issue read requests for all other data units including a parity unit in a redundant array of inexpensive disks (RAID) stripe of each errored data unit when a maximum number of retries has been exhausted;

receive error-free data units across each data unit of the RAID stripe; and

XOR-accumulate all error-free data units in a corresponding locked data buffer for each errored data unit until each errored data unit is error-free in the read buffer memory, wherein when all stripe reads for an errored data unit are error-free, the read buffer comprises an error-free data unit, and wherein when any stripe read includes errors, any errored reads are retried with one or more adjusted read voltage threshold values.

4. The system as recited in claim 1, wherein once an error-free data unit is stored in a read buffer as a result of an original read or a threshold-voltage-adjusted read retry, the error-free data unit is not modified.

5. The system as recited in claim 1, with the proviso that an errored data unit does not affect error-free data stored in the plurality of read buffers.

6. The system as recited in claim 1, wherein locking a read buffer guarantees that the locked read buffer is not overwritten by other unrelated read commands.

7. The system as recited in claim 1, wherein a maximum number of retries are attempted for each errored data unit, the maximum number of retries being set by a user.

8. The system as recited in claim 1, wherein a number of data units read from the least one NVRAM device is less than or equal to a number of the read buffers.

9. A method for reading data from non-volatile random access memory (NVRAM), the method comprising:

issuing a read request to read one or more units of data from at least one NVRAM device, the read request comprising one or more read voltage thresholds;

receiving the one or more data units and read command parameters used to read the one or more data units from the at least one NVRAM device;

performing error correction on the one or more data units, the error correction producing an error status for each data unit, wherein the error status indicates whether each data unit comprises errored data or error-free data;

determining which of a plurality of read buffers to store each of the one or more data units, wherein a read buffer memory comprises the plurality of read buffers;

storing each error-free data unit, the read command parameters, and a read completion status to one of the plurality of read buffers, wherein the read completion status indicates a completed read when the data unit is error-free and indicates an incomplete read when the data unit is errored;

storing the read command parameters, the error status, and the read completion status in one of the plurality of read buffers for each errored data unit and locking the read buffer; and retrying to read each errored data unit from the at least one NVRAM device using at least one different read voltage threshold until all of the plurality of read buffers have a data unit stored therein.

10. The method as recited in claim 9, wherein the retrying to read each errored data unit from the at least one NVRAM device further comprises:

analyzing the read command parameters for each errored data unit; and sending one or more retry read requests to the at least one NVRAM device for each errored data unit until an error-free data unit is returned or a maximum number of retries has been exhausted, each retry read request comprising at least one different read voltage threshold and new read command parameters.

11. The method as recited in claim 10, wherein the retrying to read each errored data unit from the at least one NVRAM device further comprises:

issuing read requests for all other data units including a parity unit in a redundant array of inexpensive disks (RAID) stripe of each errored data unit;

receiving error-free data units across each data unit of the RAID stripe; and

XOR-accumulating all error-free data units in a corresponding locked data buffer for each errored data unit until each errored data unit is error-free in the read buffer, wherein when all stripe reads for an errored data unit are error-free, the read buffer comprises an error-free data unit, and wherein when any stripe read include errors, any errored reads are retried with one or more adjusted read threshold values.

12. The method as recited in claim 9, wherein once an error-free data unit is stored in a read buffer as a result of an original read or a threshold-voltage-adjusted read retry, the error-free data unit is not modified.

13. The method as recited in claim 9, with the proviso that an errored data unit does not affect error-free data stored in the plurality of read buffers.

14. The method as recited in claim 9, wherein locking a read buffer guarantees that the locked read buffer is not overwritten by other unrelated read commands.

15. The method as recited in claim 9, wherein the maximum number of retries is set by a user.

16. The method as recited in claim 9, wherein a number of data units read from the least one NVRAM device is less than or equal to a number of the read buffers.

17. A computer program product for reading data from non-volatile random access memory (NVRAM), the computer program product comprising a computer readable storage medium having program code embodied therewith, the program code readable/executable by a processor to:

issue a read request to read one or more units of data from at least one NVRAM device, the read request comprising one or more read voltage thresholds;

receive the one or more data units and read command parameters used to read the one or more data units from the at least one NVRAM device;

perform error correction on the one or more data units, the error correction producing an error status for each data unit, wherein the error status indicates whether each data unit comprises errored data or error-free data;

determine which of a plurality of read buffers to store each of the one or more data units, wherein a read buffer memory comprises the plurality of read buffers;

store each error-free data unit, the read command parameters, and a read completion status to one of the plurality of read buffers, wherein the read completion status indicates a completed read when the data unit is error-free and indicates an incomplete read when the data unit is errored;

store the read command parameters, the error status, and the read completion status in one of the plurality of read buffers for each errored data unit and lock the read buffer; and retry to read each errored data unit from the at least one NVRAM device using at least one different read voltage threshold until all of the plurality of read buffers have a data unit stored therein.

18. The computer program product as recited in claim 17, wherein the program code readable/executable by the processor to retry to read each errored data unit from the at least one NVRAM device is further configured to:

analyze the read command parameters for each errored data unit; and send one or more retry read requests to the at least one NVRAM device for each errored data unit until an error-free data unit is returned or a maximum number of retries has been exhausted, each retry read request comprising at least one different read voltage threshold and new read command parameters.

19. The computer program product as recited in claim 18, wherein the program code readable/executable by the processor to retry to read each errored data unit from the at least one NVRAM device is further configured to:

issue read requests for all other data units including a parity unit in a redundant array of inexpensive disks (RAID) stripe of each errored data unit;

receive error-free data units across each data unit of the RAID stripe; and

XOR-accumulate all error-free data units in a corresponding locked data buffer for each errored data unit until each errored data unit is error-free in the read buffer, wherein when all stripe reads for an errored data unit are error-free, the read buffer comprises an error-free data unit, and wherein when any stripe read include errors, any errored reads are retried with one or more adjusted read threshold values.

20. The computer program product as recited in claim 17, wherein once an error-free data unit is stored in a read buffer as a result of an original read or a threshold-voltage-adjusted read retry, the error-free data unit is not modified.

* * * * *